(12) United States Patent
Zhang

(10) Patent No.: US 11,906,776 B2
(45) Date of Patent: Feb. 20, 2024

(54) BACKLIGHT MODULE AND DISPLAY DEVICE

(71) Applicants: Hefei BOE Display Lighting Co., Ltd., Anhui (CN); BOE Technology Group Co., Ltd., Beijing (CN)

(72) Inventor: Qiping Zhang, Beijing (CN)

(73) Assignees: Hefei BOE Display Lighting Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/036,859

(22) PCT Filed: Nov. 17, 2020

(86) PCT No.: PCT/CN2020/129497
§ 371 (c)(1),
(2) Date: May 12, 2023

(87) PCT Pub. No.: WO2022/104553
PCT Pub. Date: May 27, 2022

(65) Prior Publication Data
US 2023/0408755 A1 Dec. 21, 2023

(51) Int. Cl.
*F21V 8/00* (2006.01)
*H05K 1/18* (2006.01)
(52) U.S. Cl.
CPC ........... *G02B 6/009* (2013.01); *G02B 6/0088* (2013.01); *H05K 1/189* (2013.01); *H05K 2201/10128* (2013.01)

(58) Field of Classification Search
CPC ...... G02B 6/009; G02B 6/0088; H05K 1/189; H05K 2201/10128
See application file for complete search history.

(56) References Cited

FOREIGN PATENT DOCUMENTS

CN 107045229 A * 8/2017

OTHER PUBLICATIONS

Machine translation of CN 107045229 A (Year: 2017).*

* cited by examiner

*Primary Examiner* — Anne M Hines
*Assistant Examiner* — Jose M Diaz
(74) *Attorney, Agent, or Firm* — IPro, PLLC

(57) ABSTRACT

A backlight module includes a backplane, a light guide plate, a light bar assembly, and fixing adhesive tape. The backplane includes a bottom plate, a counter plate and a side plate connected to form an accommodating space. The light guide plate is in the accommodating space. The light bar assembly is in a U-shaped slot of the backplane and comprises a flexible circuit board and a light-emitting component. The flexible circuit board is on a side of the light guide plate facing away from the bottom plate, and the light-emitting component is at a side surface of the light guide plate. The fixing adhesive tape is between the counter plate and the flexible circuit board. The orthographic projection of the fixing adhesive tape on the bottom plate does not overlap the orthographic projection of the light-emitting component on the bottom plate.

14 Claims, 6 Drawing Sheets

BACKLIGHT MODULE AND DISPLAY DEVICE

CROSS-REFERENCE TO RELATED APPLICATIONS

This application is a National Stage of International Application No. PCT/CN2020/129497, filed Nov. 17, 2020, the entire content of which is hereby incorporated by reference.

FIELD

The present disclosure relates to the technical field of display, in particular to a backlight module and a display device.

BACKGROUND

A liquid crystal display mainly includes a liquid crystal panel and a backlight source. The backlight source is mainly a light emitting diode (LED) backlight source according to categories of light sources.

SUMMARY

Embodiments of the present disclosure provide a backlight module, including:
- a backplane, including: a bottom plate, a counter plate opposite to the bottom plate, and a side plate connecting the bottom plate and the counter plate; a part of the side plate connected to the bottom plate being arc-shaped, and the bottom plate, the side plate and the counter plate being connected in sequence to form an accommodating space and form a U-shaped slot at an end;
- a light guide plate, located in the accommodating space of the backplane;
- a light bar assembly, located in the U-shaped slot and including: a flexible circuit board and a light-emitting component fixed to the flexible circuit board; the flexible circuit board being located on a side of the light guide plate facing away from the bottom plate, and the light-emitting component being located on a side surface of the light guide plate; and
- fixing adhesive tape, located between the counter plate and the flexible circuit board; the flexible circuit board being attached to the counter plate by means of the fixing adhesive tape, and an orthographic projection of the fixing adhesive tape on the bottom plate not overlapping an orthographic projection of the light-emitting component on the bottom plate.

In a possible implementation, the flexible circuit board includes a first portion overlapping the light-emitting component, a second portion extending out of the first portion along a side towards the light guide plate, and a third portion extending out of the first portion along a side towards the side plate.

The flexible circuit board is glued to the fixing adhesive tape through the second portion so as to be attached to the counter plate.

In a possible implementation, the second portion includes an overlapping portion overlapping the fixing adhesive tape, and an extending portion extending from the overlapping portion along a side towards the light-emitting component.

In a possible implementation, in a direction pointing to the light guide plate from the light-emitting component, a length of the extending portion is 0.5 mm to 1 mm.

In a possible implementation, spacing between a surface of the first portion facing away from the light-emitting component and a first surface is equal to spacing between a surface of the overlapping portion facing away from the light guide plate and the first surface. The first surface is a surface of the counter plate facing the bottom plate.

In a possible implementation, spacing between a surface of the first portion facing away from the light-emitting component and a first surface is greater than spacing between a surface of the overlapping portion facing away from the light guide plate and the first surface. The first surface is a surface of the counter plate facing the bottom plate.

In a possible implementation, the fixing adhesive tape includes a first adhesive body, a first base material and a second adhesive body which are stacked.

In a possible implementation, the backlight module further includes pad adhesive tape located on a side of the counter plate facing away from the bottom plate.

In a possible implementation, the pad adhesive tape includes a second base material.

In a possible implementation, the backlight module further includes a fourth base material connected to the first base material and the second base material. The first base material, the second base material and the fourth base material are of an integrated structure.

In a possible implementation, a thickness of the pad adhesive tape in a direction perpendicular to the bottom plate is greater than a thickness of the fixing adhesive tape in the direction perpendicular to the bottom plate.

In a possible implementation, the pad adhesive tape further includes: a third adhesive body located between the counter plate and the second base material, a fourth adhesive body located on a side of the second base material facing away from the counter plate, and a third base material located on a side of the fourth adhesive body facing away from the second base material.

In a possible implementation, the backlight module further includes an optical film located on a side of the light guide plate facing away from the bottom plate. A gap exists between an end of the optical film facing the U-shaped slot and an end of the counter plate.

Embodiments of the present disclosure further provide a display device, including the backlight module provided by the embodiments of the present disclosure, and further including a display panel located on a light-exit side of the backlight module.

DETAILED DESCRIPTION OF THE EMBODIMENTS

Figure 1:
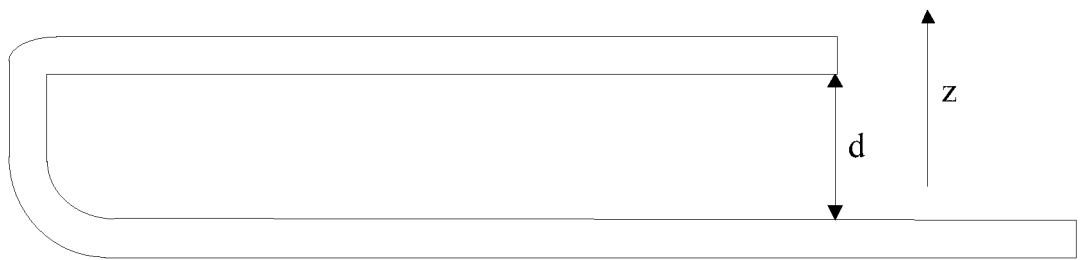
FIG. 1 is a schematic structural diagram of a backplane provided by an embodiment of the present disclosure.

In order to make objectives, technical solutions and advantages of embodiments of the present disclosure clearer, the technical solutions of the embodiments of the present disclosure will be described clearly and completely below with reference to the accompanying drawings of the embodiments of the present disclosure. It needs to be noted that sizes and shapes of all figures in the accompanying drawings do not reflect a true scale and are only intended to illustrate contents of the present disclosure. The same or similar reference numerals represent the same or similar elements or elements with the same or similar functions throughout. Apparently, the described embodiments are some, but not all embodiments of the present disclosure. Based on the described embodiments of the present disclosure, all other embodiments obtained by those ordinarily skilled in the art without creative efforts fall within the protection scope of the present disclosure.

Unless otherwise defined, technical or scientific terms used herein should have common meanings as understood by those ordinarily skilled in the art to which the present disclosure pertains. "First", "second" and similar words used in the specification and the claims of the present disclosure do not represent any sequence, quantity or significance and are only used for distinguishing different components. "Include", "contain" or similar words mean that an element or an item preceding the word covers elements or items listed after the word and their equivalents without excluding other elements or items. "Inner", "outer", "up", "down" and the like are only used for representing a relative position relationship, and when an absolute position of a described object changes, the relative position relationship may also change correspondingly.

There is an arc structure at a bottom of a backlight source module of an existing notebook so as to realize smooth transition at a corner position and achieve effects of being attractive and having a good hand feeling. A light bar is difficult to accurately position at an arc position, and the light bar in a normal design is difficult to assemble in a positive direction, so the light bar is usually assembled upside down. The light bar is fixed into a U-shaped slot of a backplane through light bar fixing adhesive tape, and the light bar is in contact with an inner side of an upper edge of the U-shaped slot of the backplane. Referring to FIG. 1, in an actual manufacturing process of a sheet metal mold, an opening size 'd' of the U-shaped slot of a backplane product has a problem of fluctuation. With the existing capacity of the manufacturing process, a maximum and minimum position difference $d_{MAX}-d_{MIN}$ is in a level of 0.1 mm. Therefore, as the light bar is fixed to the upper edge of the U-shaped slot through double-sided adhesive tape, a position of a light-emitting surface of an LED is directly affected by fluctuation of the opening size of the U-shaped slot in a direction z, and thus has a fluctuation of 0.1 mm. As for a slightly large opening size 'd' of the U-shaped slot of the backplane, as an FPC is fixed to the inner side of the upper edge of the U-shaped slot, mismatch of an edge surface of a light guide plate and a light-emitting surface of the light bar is obvious, and a position of the light-emitting surface of the light bar moves up in the direction 'z'. Given that an effective light-emitting region of an existing mainstream light bar is 0.5 mm in height, the opening size being 0.1 mm larger will lead to a great influence, and a mismatch position may cause a severe problem of light leakage. When a position of the light bar in a center fluctuates up by 0.1 mm, an obvious local brightness abnormity occurs in a visible region. In an actual product, a position with a slightly larger opening size of the U-shaped slot is neither fixed nor limited to only one location, so there is a problem of non-uniform brightness of a picture on a light-entry side visually.

Figure 2:
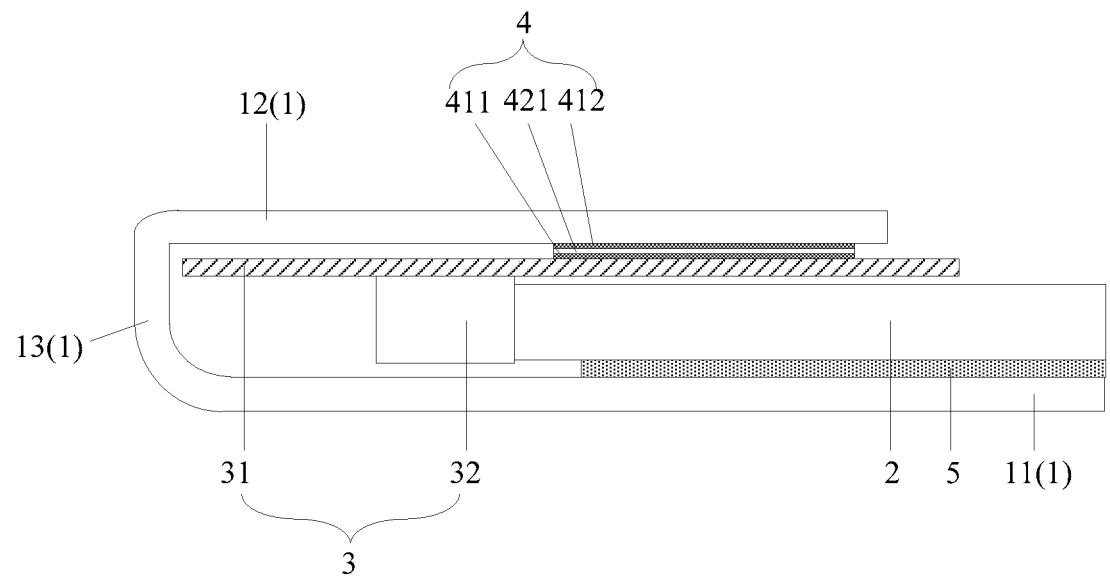
FIG. 2 is a first schematic structural diagram of a backlight module provided by an embodiment of the present disclosure.

In view of this, embodiments of the present disclosure provide a backlight module, as shown in FIG. 2.

The backlight module includes a backplane 1. The backplane 1 includes a bottom plate 11, a counter plate 12 opposite to the bottom plate 11, and a side plate 13 connecting the bottom plate 11 and the counter plate 12. A part of the side plate 13 connected to the bottom plate 11 is arc-shaped. The bottom plate 11, the side plate 13 and the counter plate 12 are connected in sequence to form an accommodating space and form a U-shaped slot at an end.

The backlight module includes a light guide plate 2 in the accommodating space of the backplane 1.

The backlight module includes a light bar assembly 3 in the U-shaped slot. The light bar assembly 3 includes a flexible circuit board 31, and a light-emitting component 32 fixed to the flexible circuit board 31. The flexible circuit board 31 is on a side of the light guide plate 2 facing away from the bottom plate 11. The light-emitting component 32 is on a side surface of the light guide plate 2. For example, the light-emitting component 32 may be an LED light bar.

The backlight module includes fixing adhesive tape 4 between the counter plate 12 and the flexible circuit board 31. The flexible circuit board 31 is attached to the counter plate 12 through the fixing adhesive tape 4. An orthographic projection of the fixing adhesive tape 4 on the bottom plate 11 does not overlap an orthographic projection of the light-emitting component 32 on the bottom plate 11.

Figure 3:
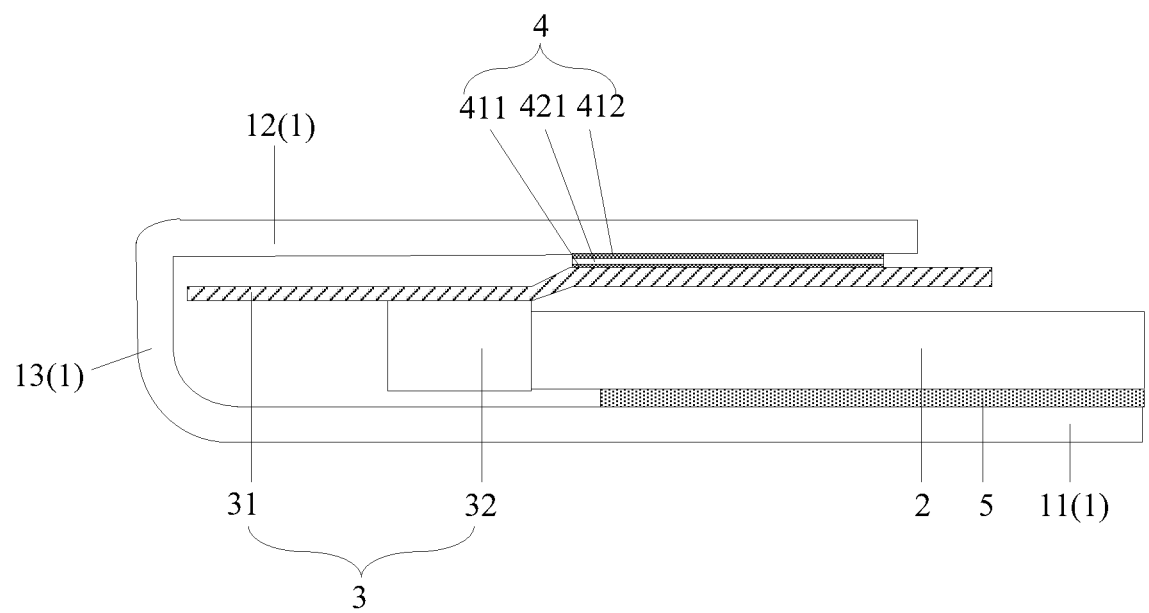
FIG. 3 is a second schematic structural diagram of a backlight module provided by an embodiment of the present disclosure.

In embodiments of the present disclosure, the light bar assembly 3 is attached to the counter plate 12 through the fixing adhesive tape 4, so that the light bar assembly 3 may be assembled upside down to avoid a problem that the light bar assembly 3 cannot be effectively positioned when the light bar assembly 3 is attached to the bottom plate 11. Besides, the orthographic projection of the fixing adhesive tape 4 on the bottom plate 11 does not overlap the orthographic projection of the light-emitting component 32 on the bottom plate 11. When an opening size of the U-shaped slot is limited technologically and is slightly larger than a normal size, as the light-emitting component 32 is not attached to the counter plate 12, drooping may occur under the action of gravity of the light-emitting component 32 (as shown in FIG. 3) so as to be approximately aligned with a side surface of the light guide plate 2, and thus a problem that light leakage occurs to the backlight module when the light-emitting component 32 and the light guide plate 2 are mismatched up and down, and consequently, non-uniform brightness of a picture effect on a light-entry side is caused may be relieved. When the opening size of the U-shaped slot is strictly made according to an expected size without a deviation, a lower end of the light-emitting component 32 is closer to the bottom plate 11, and the light-emitting component 32 may also be approximately aligned with the side surface of the light guide plate 2.

Figure 4:
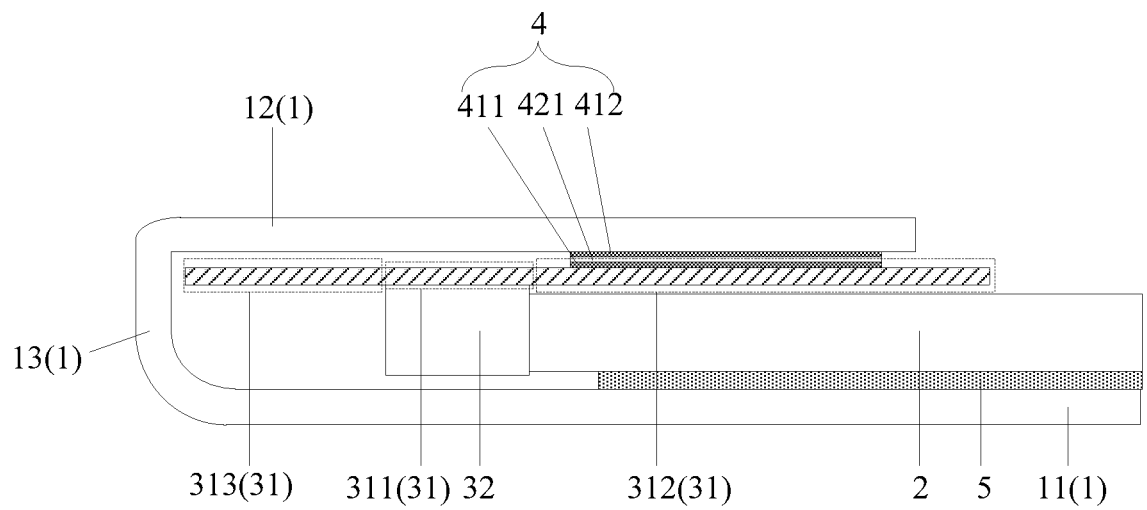
FIG. 4 is a third schematic structural diagram of a backlight module provided by an embodiment of the present disclosure.

For example, as shown in FIG. 4, the flexible circuit board 31 includes a first portion 311 overlapping the light-emitting component 32, a second portion 312 extending out of the first portion 311 along a side towards the light guide plate 2, and a third portion 313 extending out of the first portion 311 along a side towards the side plate 13. The flexible circuit board 31 is glued to the fixing adhesive tape 4 at the second portion 312 so as to be attached to the counter plate 12.

Figure 5:
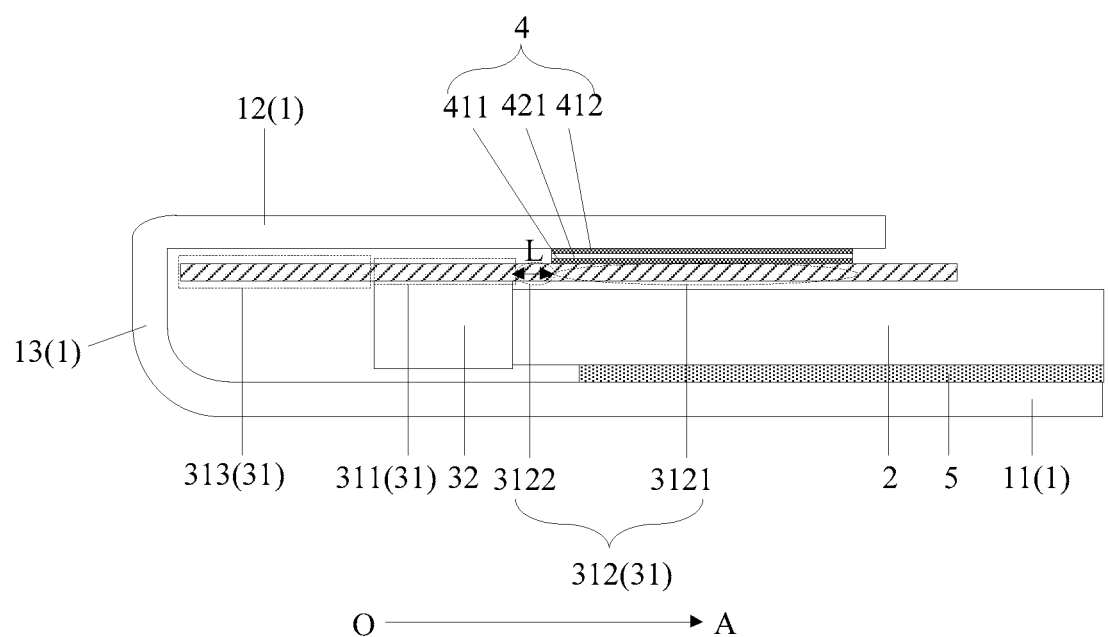
FIG. 5 is a fourth schematic structural diagram of a backlight module provided by an embodiment of the present disclosure.

During implementations, as shown in FIG. 5, the second portion 312 includes an overlapping portion 3121 overlapping the fixing adhesive tape 4, and an extending portion 3122 extending from the overlapping portion 3121 towards one side of the light-emitting component 32. That is, as shown in FIG. 5, an end of the fixing adhesive tape 4 facing the light-emitting component 32 is not aligned with an end of the light-emitting component 32 facing the light guide plate 2, and a gap exists between the two ends, so that when an opening of the U-shaped slot is slightly larger and the light-emitting component 32 droops, the flexible circuit board 31 has a moving space which allows the light-emitting component 32 to droop,. A problem that drooping due to a gravity of the light-emitting component 32 cannot be achieved because of tight attachment of a periphery of the light-emitting component 32 and the counter plate 12, when the end of the fixing adhesive tape 4 facing the light-emitting component 32 is strictly aligned with the end of the light-emitting component 32 facing the light guide plate 2, is avoided.

For example, as shown in FIG. 5, in a direction (such as a direction shown by an arrow OA in FIG. 5) of pointing to the light guide plate 2 from the light-emitting component 32, a length L of the extending portion 3122 is 0.5 mm to 1 mm, so that the whole light-emitting component 32 may droop, and then a light-emitting surface (such as a right side surface of the light-emitting component 32 in FIG. 5) of the light-emitting component 32 is approximately attached to a left side surface of the light guide plate 2. A problem that when the length L of the extending portion 3122 is too small, the light-emitting component 32 may tilt itself (for example, a left side of the light-emitting component 32 is lower than a right side of the light-emitting component 32) when drooping, an inclined seam may exist between the light-emitting surface of the light-emitting component 32 and the left side surface of the light guide plate 2, and finally the backlight module may have light leakage, may be avoided.

Figure 6:
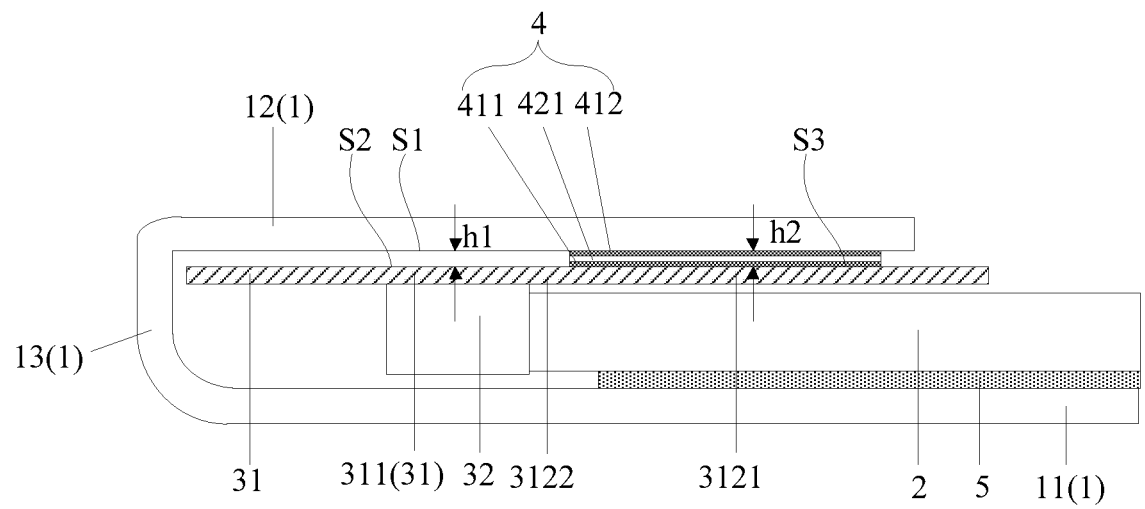
FIG. 6 is a fifth schematic structural diagram of a backlight module provided by an embodiment of the present disclosure.

In possible implementations, as shown in FIG. 6, spacing h1 between a surface S2 of the first portion 311 facing away from the light-emitting component 32 and a first surface S1 is equal to spacing h2 between a surface S3 of the overlapping portion 3121 facing away from the light guide plate 2 and the first surface S1. The first surface S1 is a surface of the counter plate 12 facing the bottom plate 11.

Figure 7:
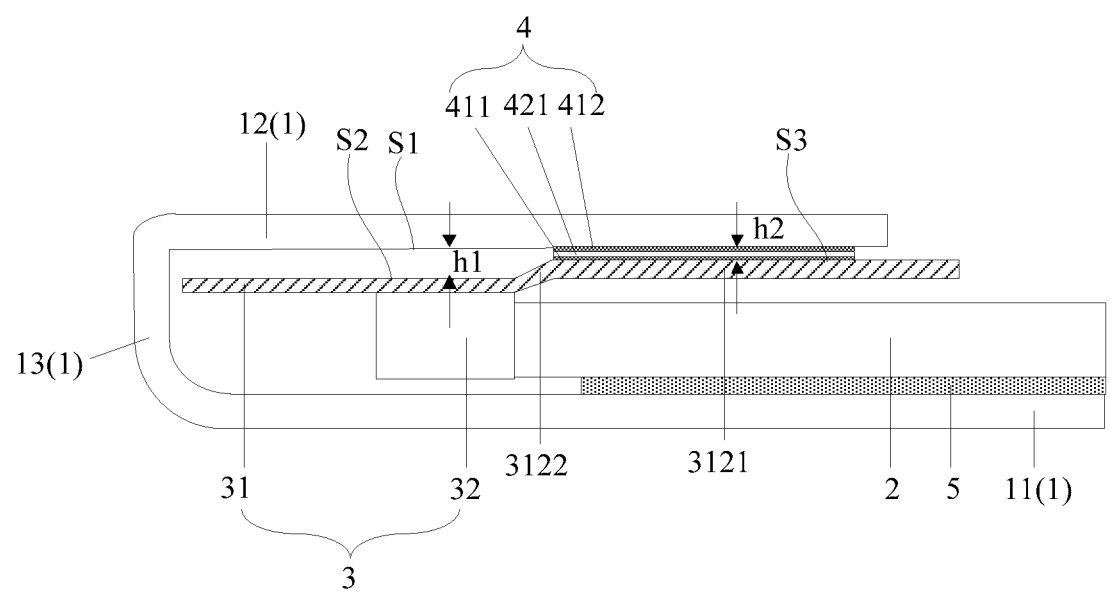
FIG. 7 is a sixth schematic structural diagram of a backlight module provided by an embodiment of the present disclosure.

In possible implementations, as shown in FIG. 7, spacing h1 between a surface S2 of the first portion 311 facing away from the light-emitting component 32 and a first surface S1 is greater than spacing h2 between a surface S3 of the overlapping portion 3121 facing away from the light guide plate 2 and the first surface S1. The first surface S1 is a surface of the counter plate 12 facing the bottom plate 11.

During implementations, as shown in FIG. 2 to FIG. 7, the fixing adhesive tape 4 includes a first adhesive body 411, a first base material 421 and a second adhesive body 412 which are stacked.

Figure 8:
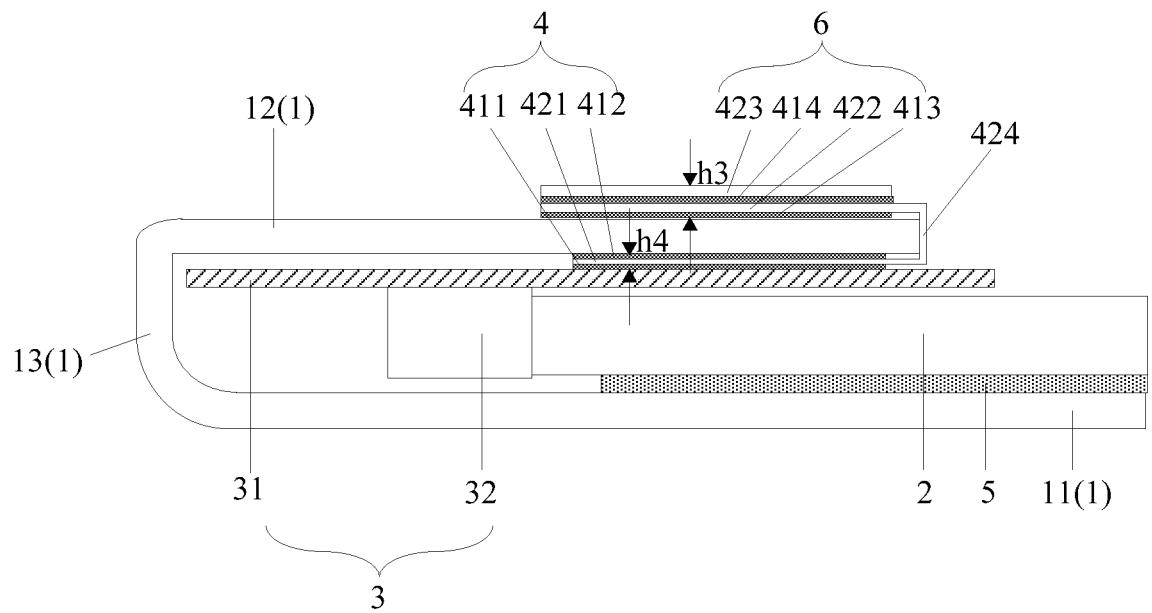
FIG. 8 is a seventh schematic structural diagram of a backlight module provided by an embodiment of the present disclosure.
Figure 9:
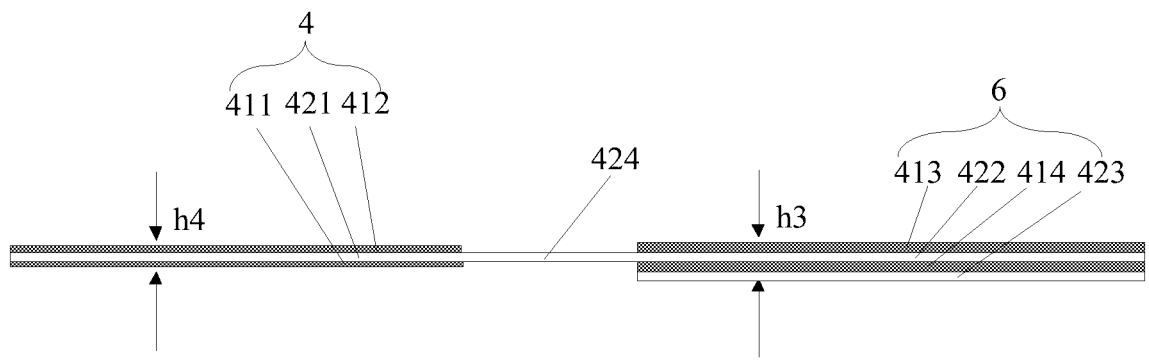
FIG. 9 is a schematic structural diagram of adhesive tape provided by an embodiment of the present disclosure.

During implementations, as shown in FIG. 8 and FIG. 9, FIG. 9 is a structure of the adhesive tape before an adhesive body is attached to the backlight module. The backlight module further includes pad adhesive tape 6 on a side of the counter plate 12 facing away from the bottom plate 11. For example, a thickness h3 of the pad adhesive tape 6 in a direction perpendicular to the bottom plate 11 may be greater than a thickness h4 of the fixing adhesive tape 4 in the direction perpendicular to the bottom plate 11. In embodiments of the present disclosure, the backlight module includes the pad adhesive tape 6 on the side of the counter plate 12 [TDIP1] facing away from the bottom plate 11, so that a display panel above the backlight module may be heightened. Moreover, as the pad adhesive tape 6 is used for heightening the display panel, the fixing adhesive tape 4 is used for gluing the light bar assembly 3, and a size needed for heightening the display panel is greater than a thickness of the fixing adhesive tape 4 gluing the light bar assembly 3, so the thickness of the pad adhesive tape 6 in the direction perpendicular to the bottom plate 11 is greater than the thickness of the fixing adhesive tape 4 in the direction perpendicular to the bottom plate 11, and the pad adhesive tape 6 and the fixing adhesive tape 4 may meet different demands respectively.

During implementations, as shown in FIG. 8 and FIG. 9, the pad adhesive tape 6 includes: a second base material 422. For example, the backlight module further includes a fourth base material 424 connected to the first base material 421 and the second base material 422. For example, the first base material 421, the second base material 422 and the fourth base material 424 are of an integrated structure. In embodiments of the present disclosure, the backlight module further includes the pad adhesive tape 6. The second base material 422 of the pad adhesive tape 6 and the first base material 421 of the fixing adhesive tape 4 are of an integrated structure, so that during attachment of the fixing adhesive tape 4, integrated attachment may be performed to form the pad adhesive tape 6, an assembling procedure of the backlight module is simplified, and efficiency is improved. Besides, during attachment, the pad adhesive tape 6 may be attached first, then the fixing adhesive tape 4 is attached, so as to avoid a problem that the fixing adhesive tape 4 cannot be easily attached to an expected position on an inner side of the U-shaped slot if the fixing adhesive tape 4 is attached first. A material of the first base material 421 may be polyethylene terephthalate (PET).

For example, the pad adhesive tape further includes: a third adhesive body 413 between the counter plate 12 and the second base material 422, a fourth adhesive body 414 on a side of the second base material 422 facing away from the counter plate 12, and a third base material 423 on a side of the fourth adhesive body 414 facing away from the second base material 422.

For example, as shown in FIG. 9, two PET surfaces of a left half portion of the tape are covered with a double-sided adhesive body (namely, the fixing adhesive tape 4). A thickness of each layer of adhesive body in the direction perpendicular to the bottom plate 11 is 0.025 mm. A right side portion of the tape is a multi-layer structure (namely, the pad adhesive tape 6), and a double-sided adhesive body is not arranged on a side of PET. A whole thickness of the right side is adjusted according to product demands, and the whole thickness may be 0.2 mm to 0.5 mm.

During implementations, a thickness of the first base material 421 in the direction perpendicular to the bottom plate 11 is 0.03 mm to 0.06 mm. For example, the thickness of the first base material 421 in the direction perpendicular to the bottom plate 11 is 0.05 mm. In embodiments of the present disclosure, the thickness of the first base material 421 in the direction perpendicular to the bottom plate 11 is small, so that the following problem may be avoided: in the embodiments of the present disclosure, when the second base material 422 of the pad adhesive tape 6 and the first base material 421 of the fixing adhesive tape 4 are of the integrated structure, and bent is occurred at an end of the counter plate 12, if the first base material 421 is thick, a tension is too large, bending is difficult, and bending deformation exists.

During implementations, as shown in FIG. 2 to FIG. 8, the backlight module further includes a reflector plate 5 between the bottom plate 11 and the light guide plate 2.

Figure 10:
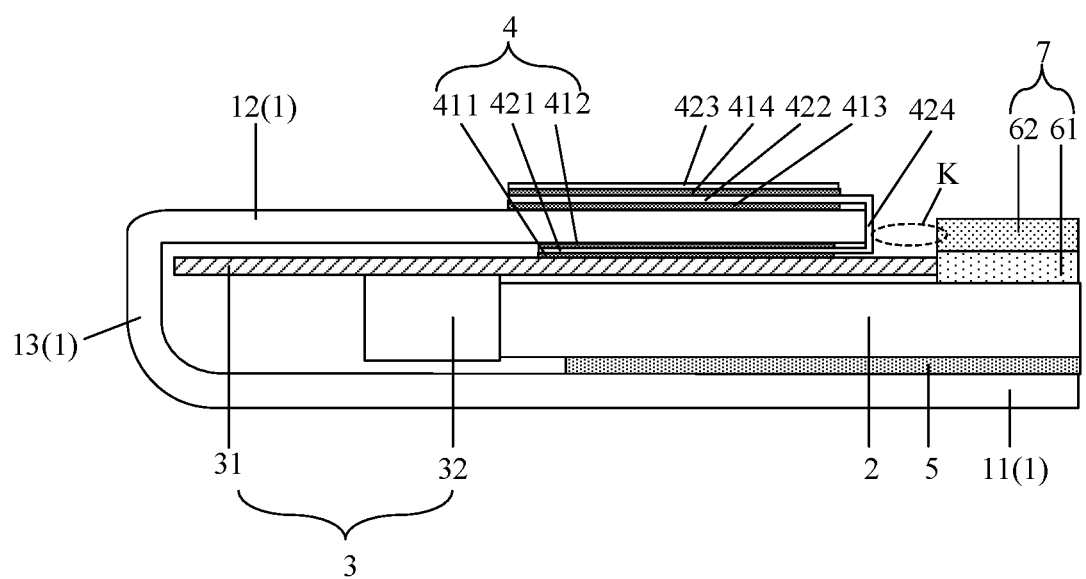
FIG. 10 is an eighth schematic structural diagram of a backlight module provided by an embodiment of the present disclosure.

During implementations, as shown in FIG. 10, the backlight module further includes an optical film 7 on a side of the light guide plate 2 facing away from the bottom plate 11. For example, the optical film 7 may include a diffuser 61 and a brightness enhancement film 62 on a side of the diffuser facing away from the light guide plate 2. A gap K exists between an end of the optical film 6 facing the U-shaped slot and the end of the counter plate 12.

Embodiments of the present disclosure further provide a display device, including the backlight module provided by the embodiments of the present disclosure and further including a display panel located on a light-exit side of the backlight module.

In embodiments of the present disclosure, the light bar assembly 3 is attached to the counter plate 12 through the fixing adhesive tape 4, so that the light bar assembly 3 may be assembled upside down, and a problem that the light bar assembly 3 cannot be effectively positioned when the light bar assembly 3 is attached to the bottom plate 11 is avoided. Besides, the orthographic projection of the fixing adhesive tape 4 on the bottom plate 11 does not overlap the orthographic projection of the light-emitting component 32 on the bottom plate 11. When an opening size of the U-shaped slot is limited technologically and is slightly larger than a normal size, as the light-emitting component 32 is not attached to the counter plate 12, drooping may occur under the action of gravity of the light-emitting component 32 (as shown in FIG. 3) so as to be approximately aligned with the side surface of the light guide plate 2, and thus a problem that light leakage occurs to the backlight module when the light-emitting component 32 and the light guide plate 2 are mismatched up and down, and consequently, non-uniform brightness of a picture effect on a light-entry side is caused may be relieved.

Though preferred embodiments of the present disclosure are already described, those skilled in the art can make extra changes and modifications to these embodiments once they know a basic inventive concept. Therefore, the appended claims are intended to be construed as including the preferred embodiments and all the changes and modifications falling within the scope of the present disclosure.

Apparently, those skilled in the art can make various modifications and variations to the embodiments of the present disclosure without departing from the spirit and scope of the embodiments of the present disclosure. In this case, if these modifications and variations of the embodiments of the present disclosure fall within the scope of the claims of the present disclosure and their equivalents, the present disclosure also intends to contain these modifications

What is claimed is:

1. A backlight module, comprising:
 a backplane comprising:
  a bottom plate;
  a counter plate opposite to the bottom plate; and
  a side plate connecting the bottom plate and the counter plate;
  wherein a part of the side plate connected to the bottom plate is arc-shaped, and the bottom plate, the side plate and the counter plate are connected to form an accommodating space and form a U-shaped slot at an end;
 a light guide plate in the accommodating space of the backplane;
 a light bar assembly, located in the U-shaped slot and comprising:
  a flexible circuit board; and
  a light-emitting component fixed to the flexible circuit board;
  wherein the flexible circuit board is on a side, facing away from the bottom plate, of the light guide plate, and the light-emitting component is at a side surface of the light guide plate; and
 fixing adhesive tape between the counter plate and the flexible circuit board;
 wherein the flexible circuit board is attached to the counter plate through the fixing adhesive tape, and an orthographic projection of the fixing adhesive tape on the bottom plate does not overlap an orthographic projection of the light-emitting component on the bottom plate.

2. The backlight module according to claim 1, wherein:
 the flexible circuit board comprises:
  a first portion overlapping the light-emitting component;
  a second portion extending out of the first portion along a side towards the light guide plate; and
  a third portion extending out of the first portion along a side towards the side plate;
  wherein the flexible circuit board is glued to the fixing adhesive tape at the second portion so as to be attached to the counter plate.

3. The backlight module according to claim 2, wherein:
 the second portion comprises:
  an overlapping portion overlapping the fixing adhesive tape; and
  an extending portion extending from the overlapping portion along a side towards the light-emitting component.

4. The backlight module according to claim 3, wherein in a direction pointing to the light guide plate from the light-emitting component, a length of the extending portion is 0.5 mm to 1 mm.

5. The backlight module according to claim 3, wherein:
 spacing between a surface of the first portion facing away from the light-emitting component and a first surface is equal to spacing between a surface of the overlapping portion facing away from the light guide plate and the first surface;
 wherein the first surface is a surface of the counter plate facing the bottom plate.

6. The backlight module according to claim 3, wherein:
 spacing between a surface of the first portion facing away from the light-emitting component and a first surface is greater than spacing between a surface of the overlapping portion facing away from the light guide plate and the first surface;
wherein the first surface is a surface of the counter plate facing the bottom plate.

7. The backlight module according to claim 1, wherein: the fixing adhesive tape comprises:
a first adhesive body, a first base material and a second adhesive body which are stacked.

8. The backlight module according to claim 7, further comprising:
pad adhesive tape on a side of the counter plate facing away from the bottom plate.

9. The backlight module according to claim 8, wherein: the pad adhesive tape comprises:
a second base material.

10. The backlight module according to claim 9, further comprising:
a fourth base material connected to the first base material and the second base material;
wherein the first base material, the second base material and the fourth base material are of an integrated structure.

11. The backlight module according to claim 10, wherein a thickness of the pad adhesive tape in a direction perpendicular to the bottom plate is greater than a thickness of the fixing adhesive tape in the direction perpendicular to the bottom plate.

12. The backlight module according to claim 10, wherein: the pad adhesive tape further comprises:
a third adhesive body between the counter plate and the second base material,
a fourth adhesive body on a side of the second base material facing away from the counter plate, and
a third base material on a side of the fourth adhesive body facing away from the second base material.

13. The backlight module according to claim 1, further comprising:
an optical film on a side of the light guide plate facing away from the bottom plate;
wherein a gap exists between an end of the optical film facing the U-shaped slot and an end of the counter plate.

14. A display device, comprising:
the backlight module according to claim 1; and
a display panel on a light-exit side of the backlight module.

* * * * *

UNITED STATES PATENT AND TRADEMARK OFFICE
CERTIFICATE OF CORRECTION

PATENT NO. : 11,906,776 B2  
APPLICATION NO. : 18/036859  
DATED : February 20, 2024  
INVENTOR(S) : Qiping Zhang Page 1 of 1

It is certified that error appears in the above-identified patent and that said Letters Patent is hereby corrected as shown below:

On the Title Page

Item (73) should read:
(73) Assignees: Hefei BOE Display Lighting Co., Ltd., Hefei, Anhui (CN); BOE Technology Group Co., Ltd., Beijing (CN)

Signed and Sealed this  
Twenty-ninth Day of July, 2025

Coke Morgan Stewart  
*Acting Director of the United States Patent and Trademark Office*